United States Patent [19]
Ichiroku et al.

[11] Patent Number: 6,117,953
[45] Date of Patent: Sep. 12, 2000

[54] LIQUID EPOXY RESIN COMPOSITION FOR BALL GRID ARRAY PACKAGE

[75] Inventors: Nobuhiro Ichiroku; Toshio Shiobara, both of Gunma-ken, Japan

[73] Assignee: Shin-Etsu Chemical Co., Ltd., Tokyo, Japan

[21] Appl. No.: 09/234,482

[22] Filed: Jan. 21, 1999

[30] Foreign Application Priority Data

Jan. 22, 1998 [JP] Japan .................................. 10-025092

[51] Int. Cl.$^7$ ............................ C08G 59/16; C08L 63/02
[52] U.S. Cl. ........................... 525/526; 257/793; 523/428
[58] Field of Search ........................... 525/526; 523/428; 257/793; 206/712

[56] References Cited

U.S. PATENT DOCUMENTS

| | | | |
|---|---|---|---|
| 3,779,949 | 12/1973 | Porret et al. | 525/526 X |
| 3,888,942 | 6/1975 | Tsen | 523/428 |
| 4,002,599 | 1/1977 | Graham | 525/526 X |
| 4,703,338 | 10/1987 | Sagami et al. | 257/793 X |
| 5,254,605 | 10/1993 | Kim et al. | 523/428 |
| 5,439,977 | 8/1995 | Yokota et al. | 525/526 X |
| 5,554,672 | 9/1996 | Saito et al. | 525/526 X |
| 5,599,628 | 2/1997 | Gardner | 525/526 X |

FOREIGN PATENT DOCUMENTS 8-259666  10/1996  Japan .

OTHER PUBLICATIONS

Semiconductor International (May 1989) P214–P218.
Nikkei Microdevices (Jul. 1987) P66–P67.

*Primary Examiner*—Richard D. Lovering
*Attorney, Agent, or Firm*—Birch, Stewart, Kolasch & Birch, LLP

[57] ABSTRACT

A liquid epoxy resin composition comprising (A) an epoxy resin component which includes specific amounts of three specific epoxy resins, (B) a curing agent, (C) a curing accelerator, and (D) an inorganic filler has a low viscosity, high cure rate, ease of processing, reliability, and shelf stability. The composition can be used as a semiconductor device encapsulant to provide BGA packages having minimal warpage.

3 Claims, No Drawings

LIQUID EPOXY RESIN COMPOSITION FOR BALL GRID ARRAY PACKAGE

BACKGROUND OF THE INVENTION

1. Field of the Invention

The present invention relates to liquid epoxy resin compositions for use in ball grid array packages. More specifically, it relates to low viscosity liquid epoxy resin compositions which cure rapidly at low temperatures, have good ease of processing, are highly reliable, and can be used as semiconductor device encapsulants to provide ball grid array packages having minimal warpage.

2. Prior Art

Semiconductor encapsulating resin compositions were originally developed and produced in order to protect integrated circuits from outside mechanical and chemical influences, but enhancements in chip reliability have recently brought about a shift in the purposes of encapsulation. For instance, improved heat dissipation and electrical characteristics have taken on greater importance as performance requirements. At the same time, solid progress has been achieved in the development of systems capable of manufacturing and packaging electronic components at low cost. One new type of package that has arisen as a result is the ball grid array (BGA).

In a BGA package, an IC chip is directly mounted onto a circuit board substrate and the chip is covered with a resin composition. The resulting construction in which only one side of the substrate is encapsulated with resin tends to cause the package to warp under the influence of temperature. Resin compositions which contain higher loadings of filler have been proposed in order to reduce the amount of warping, but the increased viscosity of such compositions generally results in poor flow and leveling characteristics.

SUMMARY OF THE INVENTION

It is therefore an object of the present invention to provide a liquid epoxy resin composition for ball grid arrays which has a low viscosity, high cure rate, good shelf stability, good ease of processing, and high reliability, and is able, when used as a semiconductor chip encapsulant, to give packages having minimal warp.

We have investigated the causes for warping in BGA packages. Owing to their structure, in which only one side of the circuit board substrate is encapsulated, BGA packages are known to be subject to warping due, in part, to a difference in the thermal shrinkages of the constituent materials. BGA packages are composed primarily of three elements: a circuit board substrate, an integrated circuit chip, and an encapsulant consisting of an epoxy resin composition. The IC chip has only about 20 to 50% the surface area of the circuit substrate, and thus cannot be the main cause of warping. Hence, warping most likely arises from a mismatch in the shrinkage factors of the circuit substrate and the epoxy resin composition. Because the epoxy resin composition has a linear expansion coefficient from room temperature to its glass transition temperature which is substantially equivalent to that of the circuit substrate, we examined the relationship between stresses during thermal shrinkage and the amount of warping in the BGA package.

In a structure like that of a BGA package, in which encapsulation has been carried out on only one side of the circuit substrate, the internal stress is known to be proportional to the initial curing temperature. It has been established that the internal stress is generally low when the epoxy resin composition is cured at a low temperature, and becomes higher when curing is carried out at a high temperature. This is because, when the resin composition is cured at a high temperature, the polymer skeleton in the polymer portion that is a constituent of the cured resin composition forms while the resin skeleton is in a stretched and elongated state. As the cured composition cools to room temperature, the polymer skeleton tries to assume an energy-stable structure, which increases the difference in thermal shrinkage with the substrate, resulting in greater internal stress. By contrast, when the epoxy resin composition is cured at a low temperature, the polymer portion assumes a crosslinked structure while the resin skeleton is in a relatively unstretched state, leading to formation of the polymer skeleton in a state closer to that at room temperature than when high-temperature curing is carried out. The result is only a small difference in thermal shrinkage, and so large internal stresses do not arise.

We have noticed that a correlation exists between the difference in thermal shrinkage and the amount of warp which arises, and also that greater warping generally occurs when curing is carried out at a high temperature whereas less warping occurs with low-temperature curing.

We have also found that when a composition comprising (A) an epoxy resin component, (B) a curing agent, (C) a curing accelerator, and (D) an inorganic filler includes as component (A) three epoxy resins having specific structures in specific amounts, there can be obtained a liquid epoxy resin composition which has a low viscosity and a rapid low-temperature cure rate, and also achieves a good balance of properties that includes excellent ease of processing, reliability, and storage stability, as well as minimal warping of the package. This composition is highly effective as an encapsulant for semiconductor devices on BGA packages.

Accordingly, the present invention provides a liquid resin composition for ball grid array packages, comprising (A) an epoxy resin component, (B) a curing agent, (C) a curing accelerator, and (D) an inorganic filler. The composition contains, per 100 parts by weight of components (A) to (C) combined, 5 to 25 parts by weight of a first epoxy resin of the following general formula (1), 5 to 25 parts by weight of a second epoxy resin of the following formula (2), and 3 to 15 parts by weight of a third epoxy resin of the following formula (3).

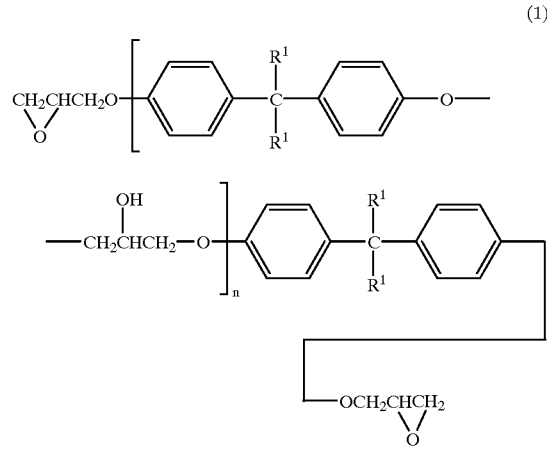

Herein $R^1$ is hydrogen or a lower alkyl with 1 to 3 carbon atoms such as methyl group, ethyl group, propyl group, and isopropyl group, and n is an integer from 0 to 5. The $R^1$s are identical or different each other.

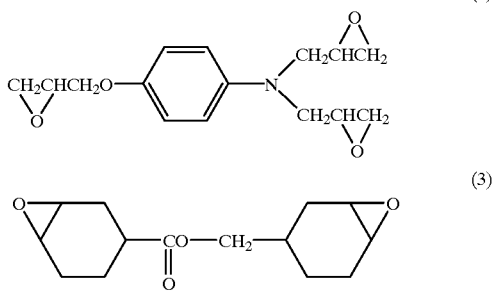

The liquid epoxy resin composition typically cures at an initial reaction rate of 0.4 to 1.1%/min up to a conversion of 5 to 25%, as measured by differential scanning calorimetry at a temperature rise rate of 10° C./min. The cured form of the composition preferably has a glass transition temperature (Tg) of at least 150° C.

DETAILED DESCRIPTION OF THE INVENTION

The liquid resin composition of the invention comprises (A) an epoxy resin component, (B) a curing agent, (C) a curing accelerator, and (D) an inorganic filler. The epoxy resin component (A) is a mixture of a first epoxy resin of formula (1), a second epoxy resin of formula (2), and a third epoxy resin of formula (3).

The amounts of the three epoxy resins included in the composition, per 100 parts by weight of the epoxy resin component (A), the curing agent (B), and the curing accelerator (C) combined, are respectively 5 to 25 parts by weight, and preferably 6 to 20 parts by weight, of the first epoxy resin of formula (1); 5 to 25 parts by weight, and preferably 8 to 20 parts by weight, of the second epoxy resin of formula (2); and 3 to 15 parts by weight, and preferably 5 to 14 parts by weight, of the third epoxy resin of formula (3). Less than 5 parts by weight of the first epoxy resin of formula (1) results in a high water absorption, and more than 25 parts by weight leads to a too viscous composition exhibiting poor filling and inadequate degassing. Less than 5 parts of the second epoxy resin of formula (2) results in a cured product having poor adhesion and reliability, whereas the inclusion of more than 25 parts of the second epoxy resin gives a composition having an inferior shelf stability. Less than 3 parts by weight of the third epoxy resin of formula (3) leads to a high viscosity and difficult processing, whereas more than 15 parts by weight yields a resin composition having a high moisture absorption and poor reliability when cured.

In the practice of this invention, if the amount of any one of the epoxy resins of formulas (1) to (3) falls outside the specific ranges noted above, this leads to one of two situations: either the reliability and shelf stability are good, but the initial reaction rate is outside the above-noted range of 0.4 to 1.1%/min, resulting in excessive warping; or the reaction rate falls within the prescribed range and the amount of warp is sufficiently low, but the reliability and shelf stability of the epoxy resin composition are inadequate. Accordingly, only when the components are specifically formulated as described above can there be obtained a liquid epoxy resin composition which cures rapidly and strikes a good balance between the amount of warp, ease of processing, reliability, and shelf stability.

Epoxy resins other than those of above formulas (1), (2), and (3) may also be included in the epoxy resin component of the inventive composition insofar as the objects of the invention are attainable. Any suitable resin having two or more epoxy groups per molecule may be used as such additional epoxy resins. Illustrative examples include novolac epoxy resins such as phenolic novolac epoxy resins and cresol novolac epoxy resins, as well as naphthalene epoxy resins, biphenyl epoxy resins, cyclopentadiene epoxy resins, triphenolalkane epoxy resins, and aralkyl epoxy resins.

Suitable examples of the curing agent serving as component (B) in the epoxy resin composition of the invention include any acid anhydride, such as tetrahydrophthalic anhydride, methyltetrahydrophthalic anhydride, methylhexahydrophthalic anhydride, hexahydrophthalic anhydride, methylhymic anhydride, pyromellitic anhydride, benzophenonetetracarboxylic anhydride, 3,3',4,4'-biphenyltetracarboxylic anhydride, bis(3,4-dicarboxylphenyl)ether anhydride, bis(3,4-dicarboxylphenyl)methane anhydride, and 2,2-bis(3,4-dicarboxylphenyl)propane anhydride. Preferably, the acid anhydride has in a molecule one or two aliphatic or aromatic rings and one or two acid anhydride groups, and has 4 to 25 carbon atoms, more preferably 8 to 20 carbon atoms.

When such an acid anhydride is used as the curing agent, incorporation within a range of 0.3 to 0.7 mole, and especially 0.4 to 0.6 mole as acid anhydride groups in the acid anhydride compound, per mole of epoxy groups in the epoxy resins, is preferred. At less than 0.3 mole, the cure rate sometimes becomes inadequate, whereas at above 0.7 mole, unreacted acid anhydride would remain present, lowering the glass transition temperature of the composition.

Other compounds that may be used as curing agents include dicyanodiamide and carboxylic hydrazides such as adipic hydrazide and isophthalic hydrazide. These curing agents may be used in amounts effective for curing.

If the curing agent is an acid anhydride, the curing accelerator serving as component (C) of the inventive composition may be at least one selected from the group consisting of imidazole derivatives and tertiary amine compounds. Exemplary imidazole derivatives include 2-methylimidazole, 2-ethylimidazole, 4-methylimidazole, 4-ethylimidazole, 2-phenylimidazole, 2-phenyl-4-methylimidazole, 2-phenyl-4-hydroxymethylimidazole, 2-ethyl-4-methylimidazole, 1-cyanoethyl-2-methylimidazole, and 2-phenyl-4,5-dihydroxymethylimidazole. Exemplary tertiary amine compounds include amine compounds having alkyl and/or aralkyl groups such as triethylamine, benzyldimethylamine and α-methylbenzyldimethylamine, cycloamidine compounds and their salts with organic acids such as 1,8-diazabicyclo[5.4.0]undecene-7 and its phenolic salt, octylic acid salt and oleic acid salt, and salts or complexes of cycloamidine compounds and quaternary boron compounds such as the compound shown below:

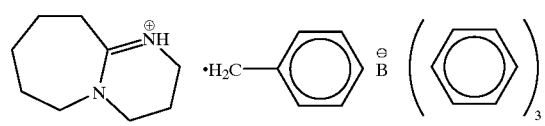

These imidazole derivatives and the tertiary amine compounds may in fact be used either as curing accelerators in combination with acid anhydride curing agents, or as curing agents for the epoxy resins. For use as curing accelerators, the compounds selected from the group consisting of the imidazole derivatives and the tertiary amine compounds are preferably added within a range of 0.01 to 10 parts by weight, and especially 0.5 to 5 parts by weight, per 100 parts by weight of the epoxy resins and curing agent combined. At less than 0.01 part by weight, the cure rate would be too slow, whereas the use of more than 10 parts by weight gives an excellent cure rate but tends to result in a decline in storage stability. The reaction rate can generally be varied by suitably adjusting the amount of curing accelerator included within the composition. However, although the addition of a large amount of curing accelerator in order to increase the reaction rate does indeed result in an excellent cure rate, the storage stability declines to such an extent as to make the composition useless for practical purposes. On the other hand, while the addition of only a small amount of curing accelerator in order to lower the reaction rate does result in a slower cure rate, the resin composition thus obtained has an inferior reliability.

Various known inorganic fillers may be added as component (D) to the composition of the invention so as to lower the thermal expansion coefficient. Examples of inorganic fillers that may be so used include fused silica, crystalline silica, alumina, boron nitride, aluminum nitride, silicon nitride, magnesia, and magnesium silicate. If the semiconductor device is an element which generates a lot of heat, it is preferable to use those inorganic fillers among the above having the largest possible thermal conductivity and the smallest possible heat expansion coefficient, such as alumina, boron nitride, aluminum nitride, or silicon nitride. These latter inorganic fillers may also be blended and used together with other suitable inorganic fillers such as fused silica.

Advantageously, the particle size distribution of the inorganic filler will be characterized by a mean particle size of 2 to 30 microns and a maximum particle size of not more than 74 microns. At a mean particle size smaller than 2 microns, the viscosity becomes too high to allow high loadings of the filler, whereas a mean particle size greater than 30 microns results in numerous coarse particles which could clog a dispenser fitted with a fine-gauge needle. The mean particle size can be determined as a weight mean diameter or median diameter by a particle size distribution measuring device based on such a process as laser light diffraction process.

The particles in the inorganic filler may have any shape. For example, fillers composed of particles that are flake-like, dendritic, spherical or have other shapes may be used alone or in admixture. Ultrafine silica having a mean particle size of 0.1 $\mu$m or less such as Aerosil may also be added in combination with the above-described inorganic filler to confer thixotropic properties.

The inorganic filler used in the practice of the invention preferably has been surface treated with a coupling agent such as a silane coupling agent (i.e., organoalkoxy-silanes having a functional group such as epoxy group, amino group, mercapto group, alkenyl group, and (meth)acrylic group) or a titanium coupling agent (for example, organic titanium compounds such as titanic acid esters and titanium chelate compounds).

Advantageously, the inorganic filler is used in an amount, per 100 parts by weight of components (A) to (C) combined, of 100 to 900 parts by weight, preferably 250 to 800 parts by weight, and especially in an amount which accounts for 65 to 90%, preferably 70 to 85% of the overall weight of the composition. At a filler content of less than 65% by weight, the linear expansion coefficient of the epoxy resin composition would rise, resulting in excessive warpage during molding. On the other hand, a filler content of more than 90% by weight would increase the viscosity of the resin composition, giving it poor flow and leveling properties.

The epoxy resin composition of the invention may be prepared by simultaneously mixing all the components, including the epoxy resins, curing agent, curing accelerator, and inorganic filler. However, it is preferable to begin by stirring, melting, mixing, and dispersing, with heat treatment if necessary, the epoxy resins, curing agent, and curing accelerator, either at the same time or separately. The inorganic filler is then added to the resulting mixture, following which mixing, stirring, and dispersing are again carried out so as to complete preparation. Any suitable apparatuses may be used for mixing, stirring, dispersing and other operations in the preparation of the inventive compositions. Examples include orbiting mortar and pestle mixers, three-roll mills, ball mills, and planetary mixers equipped with stirrers and heaters.

The resulting epoxy resin composition of the invention preferably cures at a reaction rate within a range of 0.4 to 1.1%/min up to a conversion of 5 to 25%, as measured by differential scanning calorimetry at a temperature rise rate of 10° C./min. If the initial reaction rate is less than 0.4%/min, the composition would not cure sufficiently at low temperatures, as a result of which the cured resin might have a low crosslink density, giving a cured product having a poor reliability. On the other hand, if the initial reaction rate is greater than 1.1%/min, the high reactivity would detract from the storage stability of the composition, in addition to which the excessive reaction rate would cause the reaction to proceed self-exothermically, as a result of which the composition cures at a temperature higher than the ambient temperature, which ultimately increases warping of the package.

The glass transition temperature (Tg) of the inventive epoxy resin composition when cured is preferably at least 150° C., and especially 150 to 170° C. If the Tg is less than 150° C., warping of the package would increase to such an extent as to make it impossible to properly mount a semiconductor device on the circuit board substrate and encapsulate it with the inventive composition. In such cases, the epoxy resin composition acquires a rubber-like state at and above Tg, as a result of which the thermal expansion coefficient becomes several times greater than at room temperature. Because warping of the BGA package at room temperature becomes severe if the resin composition is already in a complete rubber-like state at the molding temperature of 175° C., a relatively high Tg as indicated above is preferred.

It is noted that the glass transition temperature of the cured epoxy resin composition is measured using a test piece fabricated by pouring the liquid epoxy resin composition into a mold measuring 4×4×15 mm and degassing, then heat-curing, first at 100° C. for 1 hour, then at 175° C. for 2 hours. The test piece is placed in a dilatometer, and measurement is carried out while raising the temperature at a rate of 10° C. per minute. The expansion curve for the test piece is plotted, the linear portions of the curve at 30 to 50° C. and at 200 to 230° C. are extrapolated, and the point of intersection between the extrapolated lines is taken as Tg.

The viscosity of the inventive epoxy resin composition may be adjusted as appropriate so long as the composition is liquid, although an appropriate viscosity is within the range of 250 to 500 poise as measured with a Brookfield viscometer at 25° C. and 20 rpm.

The inventive composition is readily curable by heating. Curing may be effected under any suitable conditions, although a curing temperature of 100 to 190° C. and a curing time of 0.5 to 10 hours is generally preferred.

There has been described a liquid epoxy resin composition for BGA packages which has a low viscosity and a rapid cure rate, provides good ease of processing, high reliability, and good storage stability, and gives BGA packages having minimal warpage. These qualities make the composition highly effective for encapsulating semiconductor devices on BGA packages.

EXAMPLES

The following examples are provided to illustrate the invention, and are not intended to limit the scope thereof. All parts in the examples are by weight.

Examples 1–8 & Comparative Examples 1–9

Liquid epoxy resin compositions were formulated as shown in Tables 1 and 2 for each of the examples and comparative examples from the bisphenol A epoxy resin of formula (4) below (RE310S, from Nippon Kayaku K.K.), the alicyclic epoxy resin of formula (5) below (Araldite CY 179, from Nagase-Ciba K.K.), and the polyfunctional epoxy resin of formula (6) below (Epikote 630, from Yuka Shell Epoxy K.K.) as the three liquid epoxy resins, an acid anhydride (Rikacid MH 700, from New Japan Chemical K.K.) as the curing agent, fused silica (SE 15, mean particle size 15 μm; from Tokuyama Soda K.K.), a silane coupling agent (γ-glycidoxypropyltrimethoxysilane; KBM 403, from Shin-Etsu Chemical Co., Ltd.), and a curing accelerator (UCAT 5002, from Asahi Chemical Industry K.K.).

RE 310S

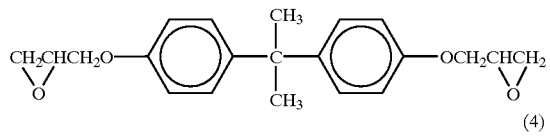

(4)

Araldite CT 179

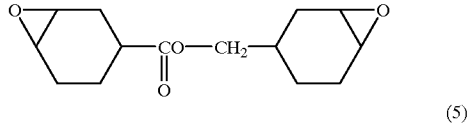

(5)

Epikote 630

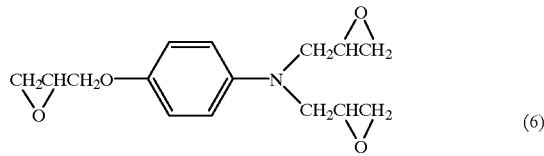

(6)

Acid Anhydride (Rikacid MH 700)

7:3 mixture of 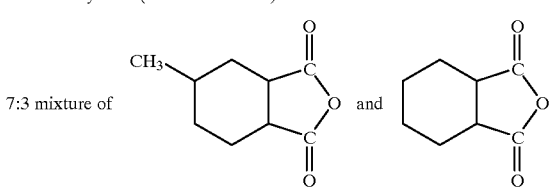

Curing Accelerator (UCAT 5002)

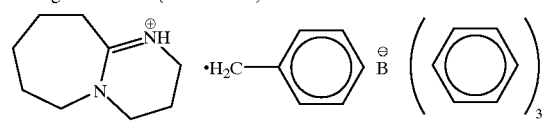

The properties of the resulting liquid epoxy resin compositions were measured using the methods described below. The results are shown in Tables 1 and 2.

Viscosity:

The viscosity was measured with a Brookfield viscometer at 25° C. and 20 rpm.

Initial Reaction Rate:

Differential scanning calorimetry was carried out with a Mettler TA 4000 Thermoanalyzer (Mettler Instrument Corp.) while heating the liquid epoxy resin composition at a rate of 10° C./min. The initial reaction rate was obtained by determining the slope of the first-order regression line for the integrated endotherms and exotherms within a conversion range of 5 to 25%.

Glass Transition Temperature (Tg):

A test piece was fabricated by pouring the epoxy resin composition into a mold measuring 4×4×15 mm and degassing, then heat-curing, first at 100° C. for 1 hour, then at 175° C. for 2 hours. The test piece was placed in a dilatometer, and measurement was carried out while raising the temperature at a rate of 10° C. per minute. The expansion curve for the test piece was plotted, the linear portions of the curve at 30 to 50° C. and at 200 to 230° C. were extrapolated, and the point of intersection between the extrapolated lines was taken as Tg.

Warpage:

A dummy BGA package was fabricated in which a dummy chip was encapsulated with the liquid epoxy resin composition to dimensions of 23×23×1.4 mm on a bismaleimide substrate measuring 30×30×0.5 mm. Using an optical undulation tester, the liquid epoxy resin portion was measured at the diagonals, and the difference in height between the highest portion and the lowest portion across a width of 27 mm was taken as the warpage.

Water Absorption:

Discs having a thickness of 2 mm and a diameter of 50 mm were fabricated from each of the epoxy resin compositions, and heat treated at 100° C. for 1 hour, then at 175° C. for 2 hours. The heat-treated discs were placed in a pressure cooker at 120° C. for 96 hours, following which the water absorption (wt %) of the discs was measured.

TABLE 1

| Components (pbw) | | Ex. 1 | Ex. 2 | Ex. 3 | Ex. 4 | Ex. 5 | Ex. 6 | Ex. 7 | Ex. 8 |
|---|---|---|---|---|---|---|---|---|---|
| Epoxy Resins | RE 310 | 6.9 | 13.8 | 20.6 | 11.6 | 18.5 | 24.3 | 17.3 | 24.2 |
| | Epikote 630 | 22.0 | 17.0 | 12.0 | 20.0 | 15.0 | 10.0 | 20.0 | 15.0 |
| | Araldite CY 179 | 14.0 | 14.0 | 14.0 | 10.0 | 10.0 | 10.0 | 5.0 | 5.0 |
| Curing agent (MH 700) | | 57.1 | 55.2 | 53.4 | 56.4 | 54.5 | 52.7 | 55.7 | 53.8 |
| Silane coupling agent (KBM 403) | | 1.0 | 1.0 | 1.0 | 1.0 | 1.0 | 1.0 | 1.0 | 1.0 |
| Curing accelerator (UCAT 5002) | | 1.0 | 1.0 | 1.0 | 1.0 | 1.0 | 1.0 | 1.0 | 1.0 |
| Fused silica (SE 15) | | 300.0 | 300.0 | 300.0 | 300.0 | 300.0 | 300.0 | 300.0 | 300.0 |
| Properties | | | | | | | | | |
| Viscosity (poise) | | 310 | 330 | 360 | 370 | 380 | 450 | 430 | 460 |
| Tg (° C.) | | 156 | 158 | 154 | 157 | 161 | 159 | 156 | 152 |
| Initial reaction rate (%/min) | | 0.6 | 0.6 | 0.5 | 0.8 | 0.9 | 0.9 | 1.0 | 1.1 |
| Warpage (μm) | | 65 | 60 | 50 | 65 | 70 | 75 | 85 | 85 |
| 96-hr PCT moisture absorption (wt %) | | 0.92 | 0.89 | 0.83 | 0.85 | 0.80 | 0.82 | 0.81 | 0.79 |

TABLE 2

| Components (pbw) | | CE1 | CE2 | CE3 | CE4 | CE5 | CE6 | CE7 | CE8 | CE9 |
|---|---|---|---|---|---|---|---|---|---|---|
| Epoxy Resins | RE 310 | 50.4 | 42.7 | — | 4.0 | 9.3 | — | 43.7 | — | — |
| | Epikote 630 | — | 4.0 | 36.8 | 32.2 | 30.0 | 30.0 | 4.0 | 37.8 | 31.0 |
| | Araldite CY 179 | — | 2.0 | — | 2.0 | — | 8.2 | 2.0 | — | 8.2 |
| Curing agent (MH 700) | | 47.6 | 49.3 | 61.2 | 59.8 | 58.7 | 59.8 | 49.3 | 61.2 | 59.8 |
| Silane coupling agent (KBM 403) | | 1.0 | 1.0 | 1.0 | 1.0 | 1.0 | 1.0 | 1.0 | 1.0 | 1.0 |
| Curing accelerator (UCAT 5002) | | 1.0 | 1.0 | 1.0 | 1.0 | 1.0 | 1.0 | 0.005 | 0.005 | 0.005 |
| Fused silica (SE 15) | | 300.0 | 300.0 | 300.0 | 300.0 | 300.0 | 300.0 | 300.0 | 300.0 | 300.0 |
| Properties | | | | | | | | | | |
| Viscosity (poise) | | 700 | 650 | 200 | 250 | 280 | 220 | 650 | 200 | 220 |
| Tg (° C.) | | 138 | 142 | 145 | 143 | 148 | 150 | 102 | 115 | 108 |
| Initial reaction rate (%/min) | | 1.3 | 1.3 | 1.4 | 1.4 | 1.2 | 1.3 | 0.7 | 0.9 | 0.8 |
| Warpage (μm) | | 180 | 200 | 220 | 190 | 160 | 140 | 300 | 260 | 230 |
| 96-hr PCT moisture absorption (wt %) | | 0.73 | 0.75 | 1.22 | 1.19 | 1.11 | 1.19 | 1.45 | 1.34 | 1.30 |

As is evident from the results in Tables 1 and 2, the liquid epoxy resin compositions of this invention have a low viscosity and excellent curing speed, maintain a good ease of processing and a high reliability when cured, have a good shelf stability, and yield packages having minimal warpage.

Japanese Patent Application No. 025092/1998 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A liquid resin composition for ball grid array packages, comprising (A) an epoxy resin component, (B) a curing agent, (C) a curing accelerator, and (D) an inorganic filler, said epoxy resin component (A) comprising, per 100 parts by weight of components (A) to (C) combined, 5 to 25 parts by weight of a first epoxy resin of the following general formula (1), 5 to 25 parts by weight of a second epoxy resin of the following formula (2), and 3 to 15 parts by weight of a third epoxy resin of the following formula (3):

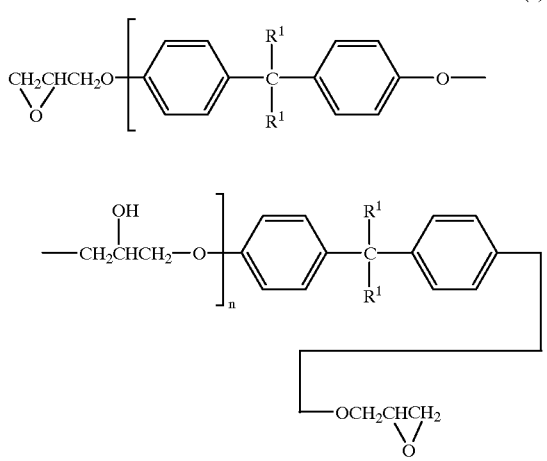

wherein $R^1$ is hydrogen or a lower alkyl with 1 to 3 carbon atoms, and n is an integer from 0 to 5, (2)
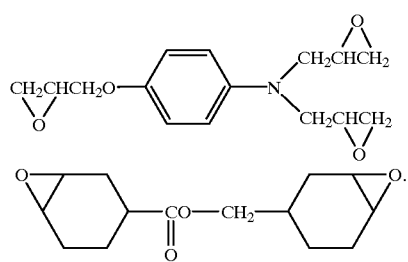
(3)
2. The composition of claim 1 which cures at a reaction rate of 0.4 to 1.1%/min up to a conversion of 5 to 25%, as measured by differential scanning calorimetry at a temperature rise rate of 10° C./min.
3. The composition of claim 1 which, in cured form, has a glass transition temperature of at least 150° C.
* * * * *